(12) United States Patent
Chen et al.

(10) Patent No.: US 12,170,208 B2
(45) Date of Patent: Dec. 17, 2024

(54) METHOD FOR MANAGING TEMPERATURE IN SEMICONDUCTOR FABRICATION FACILITY

(71) Applicant: TAIWAN SEMICONDUCTOR MANUFACTURING COMPANY LTD., Hsinchu (TW)

(72) Inventors: Otto Chen, Tainan (TW); Ying-Yen Tseng, Hsinchu (TW); Wen-Yu Ku, Hsinchu (TW); Chia-Chih Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 791 days.

(21) Appl. No.: 17/333,560

(22) Filed: May 28, 2021

(65) Prior Publication Data
US 2022/0384214 A1 Dec. 1, 2022

(51) Int. Cl.
*H01L 21/67* (2006.01)
(52) U.S. Cl.
CPC .............................. *H01L 21/67017* (2013.01)
(58) Field of Classification Search
CPC ............... H01J 37/321; H01J 37/32715; H01J 37/3244; H01J 2237/334; H01J 37/3056; H01J 21/67069; H01J 21/3065
See application file for complete search history.

(56) References Cited

U.S. PATENT DOCUMENTS

2002/0172764 A1* 11/2002 Caldwell ........... H01L 21/68757
118/728
2022/0115209 A1* 4/2022 Kim ................. H01J 37/32174

* cited by examiner

*Primary Examiner* — Nelson J Nieves
*Assistant Examiner* — Meraj A Shaikh
(74) *Attorney, Agent, or Firm* — WPAT LAW; Anthony King

(57) ABSTRACT

A semiconductor fabrication facility is provided. The semiconductor fabrication facility includes a processing tool and a transmission assembly. The transmission assembly is connected to the processing tool and comprises a number of transmission lines used to supply electric power or a fluid to the processing tool or remove the fluid or an exhaust gas from the processing tool. The transmission lines includes a first transmission line and a second transmission line. The first transmission line has a first temperature and the second transmission line has a second temperature. The second temperature is higher than the first temperature. The first transmission line and the second transmission line are arranged such that a thermal energy of the second transmission line is able to be transmitted to the first transmission line to change the first temperature of the first transmission line.

20 Claims, 9 Drawing Sheets

METHOD FOR MANAGING TEMPERATURE IN SEMICONDUCTOR FABRICATION FACILITY

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing have been needed. For example, the need to perform higher resolution lithography processes grows. One lithography technique is extreme ultraviolet lithography (EUVL). The EUVL technologies may consume twenty times more power than the previous generation, which results in an increase in power consumption and manufacturing cost. Furthermore, during the delivering of the electric power to these processing tools, a significant amount of heat is generated through the electrical loading of power cables. The heat not only causes a waste of energy but also leads an increase in a power cable impedance, thereby adversely reducing an energy transmission efficiency. Accordingly, what is needed is a system and method for utilizing the waste heat produced during the semiconductor manufacturing that addresses the above-discussed issues.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
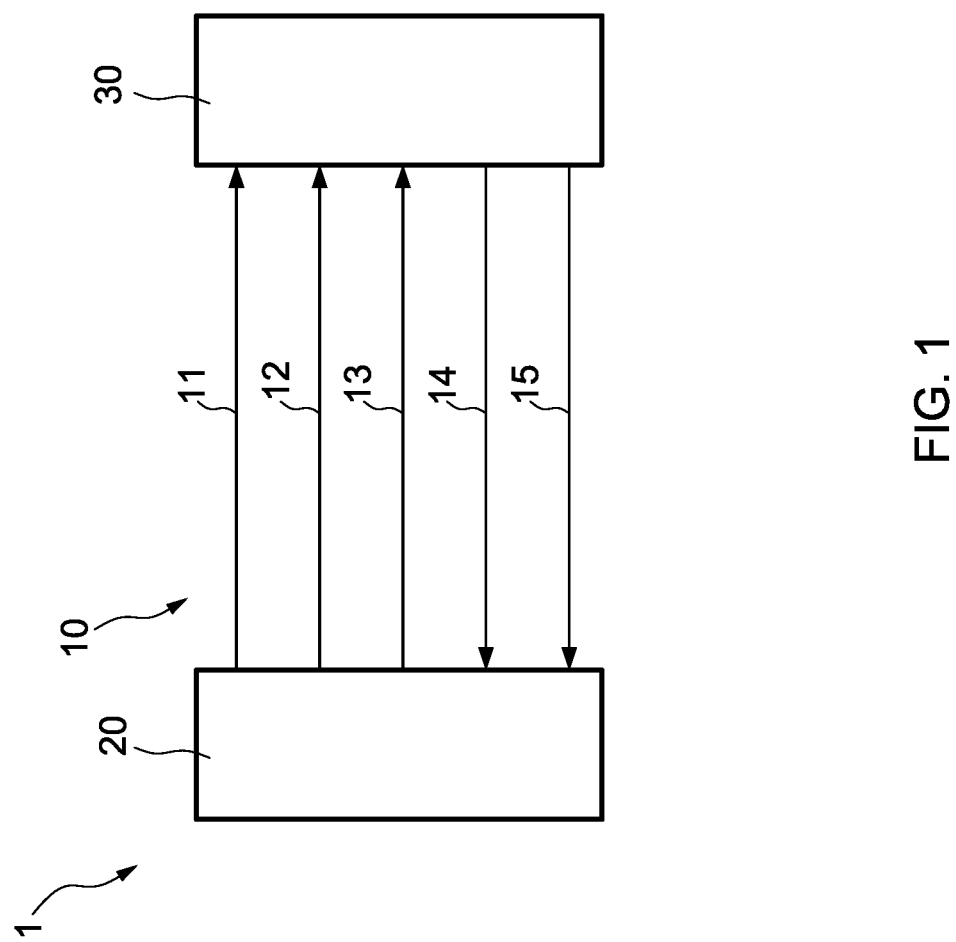
FIG. 1 is a schematic view of a semiconductor fabrication facility, in accordance with some embodiments of present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

As used herein, "fluid" means a flowable material in the liquid phase, or in a combination of the liquid phase and the solid phase. Examples of flowable material in the liquid phase include, but are not limited to, process cooling water (PCW), deionized water (DI), deionized water mixed with $CO_2$ (hereinafter "$CO_2$-DI water") and various wafer processing chemicals.

As used herein, the terms "line," "piping," and "tubing" are used interchangeably and refer to any type, size, or configuration of flow conduit conventionally used in the art for transporting liquids (including PCW) and/or gaseous materials (including exhaust gas) and combinations thereof.

Semiconductor fabrication facility includes a vast amount of different components ranging from various process equipment, product stockers and transportation systems, and facilities support equipment which may include power cables, gas cylinders, exhaust lines, gas lines, chemical lines, power supplies, and vacuum pumps. For the fluid conveyed by the gas lines or exhaust lines, a decrease in the temperature of the fluid may adversely cause the generation of toting condense in the exhaust lines or impact the flowing rate of gas in the gas line. Furthermore, an increase in temperature of power cable may leads an increase of manufacturing cost. Accordingly, one objective of the present disclosure is to provide a system and method of manage heat in semiconductor manufacturing.

Please refer FIG. 1, which shows a schematic view of a semiconductor fabrication facility 1, in accordance with some embodiments of present disclosure. According to some embodiments, the semiconductor fabrication facility 1 includes a transmission assembly 10, a facility system 20 and one or more processing tools 30.

The transmission assembly 10 is configured for transmission of electric power, gas material, liquid material or exhaust gas between the facility system 20 and the processing tools 30. The facility system 20 may provide utility services to the processing tools 30 in a cleanroom production zone. These services include, but are not limited to, supplying of process cooling water, bulk high purity gases such as nitrogen and argon, exhaust gas handling and disposal, and cleanroom air systems. The processing tools 30 includes one or more wafer processing equipment configured to perform one or more processes on semiconductor wafers. Examples of processing performed by the processing tool 30 include, but are not limited to, film deposition, etching, stripping, cleaning, planarization (e.g., chemical-mechanical planarization) and polishing (e.g., chemical-mechanical polishing). The processing tool 30 may include a wafer handling structure to support, secure, move, or otherwise handle a semiconductor wafer during processing of the semiconductor wafer. The semiconductor wafer may include electrical features on a front side. In some embodiments, the semiconductor wafer may be a monocrystalline silicon (Si) wafer, an amorphous Si wafer, a gallium arsenide (GaAs) wafer, or any other semiconductor wafer.

In some embodiments, as shown FIG. 1, the transmission assembly 10 includes a number of transmission lines, such as a power cable 11 and a number of fluid conduits 12, 13, 14 and 15. It will be appreciated the number of each of transmission lines may be varied according to demands and is not limited to the embodiment shown in FIG. 1. The power cable 11 is used for electricity delivery to the processing tools 30. The power cable 11 is an assembly of one or more electrical conductors, held together with an overall sheath. The material of the sheath includes polyethylene, galvanized steel wire or the like. The thickness of the sheath may be in a range of about 0.6 mm to about 2.8 mm. The diameter of the power cable 11 may be in a range of about 12.1 mm to about 100.1 mm.

The fluid conduits 12, 13, 14 and 15 are used to deliver liquid between the facility system 20 and the processing tools 30. In some embodiments, the fluid conduit 12 is used to supply gases to the processing tools 30 for semiconductor process, including, but are not limited to, gases used in oxidation process, diffusion process, epitaxy process, chemical vapor deposition process, implant process, etching process and dephotoresist process. The gases used in a semiconductor device manufacturing plant may be of extremely high purity at their source and this purity must be maintained throughout the gas distribution systems that exist within the plant. As a result, an increase in temperature in the gas distribution system may decrease the flowing rate of the gases in the fluid conduit 12. The change of flowing rate of gases may adversely affect the supply amount precision of gases to the processing tool and degrades the product yields of the semiconductor products. Material of the fluid conduit 12 for delivering the gases may include 316L stainless steel or the like. The thickness of the fluid conduit 12 may be ranged from about 0.3 mm to about 2.0 mm. The diameter of the fluid conduit 12 may be ranged from about 10.2 mm to about 100.1 mm.

In some embodiments, the fluid conduit 13 is used to supply PCW to the processing tools 30, and the fluid conduit 14 is used to remove PCW from the processing tools 30. PCW is used for many semiconductor process steps to cool various processes in the plant, or may be used as cooling water for other functions. In one exemplar embodiment, PCW has a temperature of about 19 Celsius degrees. Material of the conduits 13 and 14 for delivering PCW may include SUS304 stainless steel tube or the like. The thickness of the fluid conduits 13 and 14 may be ranged from about 0.2 mm to about 2.0 mm. The diameter of the fluid conduits 13 and 14 may be ranged from about 10.2 mm to about 200.1 mm.

In some embodiments, the fluid conduit 15 is used to remove exhaust gas from the processing tools 30. The process exhaust may be produced from the cleaning, deposition and metal etch processes employed in a semiconductor fab. The exhaust gas frequently contain very corrosive and/or toxic gases that will be removed by chemical scrubbing in the facility system 20 prior to release to the atmosphere. During the delivery of the exhaust gas, a condensation and build-up of solid or liquid process by-products on the internal surfaces of vacuum components and exhaust lines may occur. Such build-up can be controlled by maintaining the exposed surfaces at elevated temperatures. Material of the fluid conduit 15 for delivering exhaust gas may include stainless steel with or without a thin layer of zinc at its internal surface to create a corrosion-resistant barrier. The thickness of the fluid conduit 15 may be ranged from about 0.5 mm to about 1.2 mm. The diameter of the fluid conduit 15 may be ranged from about 100 mm to about 2500 mm.

As mentioned above, the power cables 11 produce waste heat, and the fluid conduits 12-15 has a lower temperature than that of the power cables 11 and some issues of the fluid conduits may be prevented by an elevated temperature. As a result, embodiments of the present disclosure provides various embodiments below to realize heat utilization in the semiconductor fabrication facility.

Figure 2:
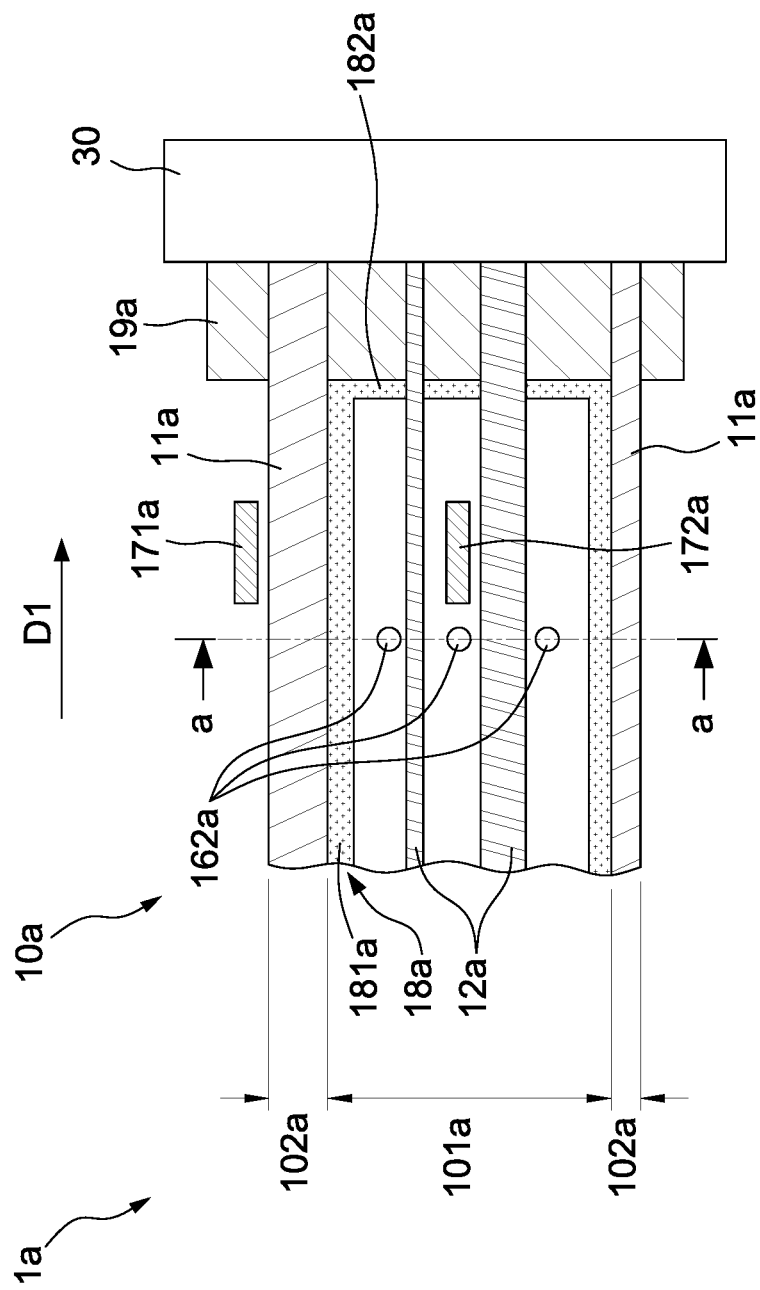
FIG. 2 is a schematic cross-sectional view of partial elements in a semiconductor fabrication facility taken along an axial direction of a transmission assembly, in accordance with some embodiments of present disclosure.
Figure 3:
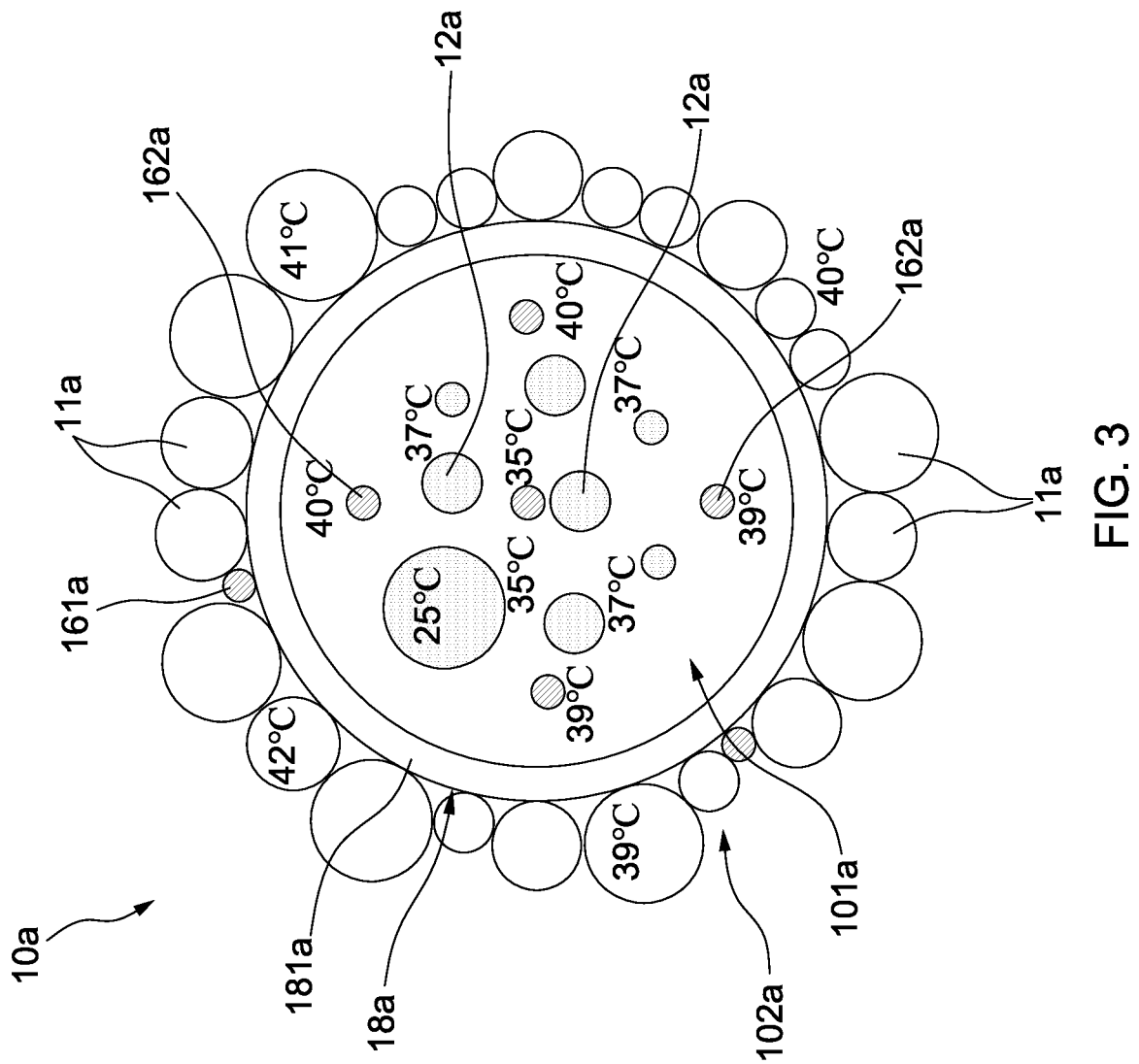
FIG. 3 is a schematic cross-sectional view taken along line a-a of FIG. 2.

Please refer FIGS. 2 and 3, FIG. 2 is a schematic cross-sectional view of partial elements in a semiconductor fabrication facility 1a taken along an axial direction of a transmission assembly 10a, in accordance with some embodiments of present disclosure, and FIG. 3 is a schematic cross-sectional view taken along line a-a of FIG. 2. In FIG. 3, symbols without lead lines represent temperatures of corresponding elements or temperature of the nearby surrounding. The components in FIGS. 2 and 3 that use the similar reference numerals as the components of FIG. 1 refer to the same components or equivalent components thereof. For the sake of brevity, the discussion of the semiconductor fabrication facility 1a will focus on the difference between the semiconductor fabrication facility 1a and the semiconductor fabrication facility 1.

In some embodiments, the transmission assembly 10a of the semiconductor fabrication facility 1a is used to deliver electric power and gas from the facility system (see FIG. 1) to the processing tool 30 and includes a number of power cables 11a, a number of fluid conduits 12a, an intermediate member 18a, and a thermal insulation member 19a. The transmission assembly 10a has a substantially circular cross-section which defines a central region 101a and a peripheral region 102a.

The intermediate member 18a is configured to regulate a transmission of thermal energy between the transmission lines located in the peripheral region 102a (i.e., power cables 11a) and the transmission lines located in the central region 101a (i.e., fluid conduit 12a). In some embodiments, the intermediate member 18a includes a side wall 181a and an end wall 182a. The side wall 181a has a ring-shaped and is located at the interface of the central region 101a and the peripheral region 102a. The end wall 182a is connected to an end of the side wall 181a and is located adjacent to the processing tool 30. In some embodiments, the intermediate member 18a is a metal sheet with a relatively high thermal conductivity so as to allow the heat generated by the power cables 11a to be evenly distributed around the transmission assembly 10a. In some embodiments, the intermediate member 18a is omitted, the power cables may be suspended around the fluid conduit 12a by suitable means.

The power cables 11a are located in the peripheral region 102a of the transmission assembly 10a, and the fluid conduits 12a are located in the central region 101a of the transmission assembly 10a. In some embodiments, as shown in FIG. 3, the power cables 11a are in directly contact with the intermediate member 18a, and the fluid conduits 12a are distant away from the intermediate member 18a. In some embodiments, the power cables 11a and the fluid conduits 12a may have varied diameters. The power cables 11a and the fluid conduits 12a extend along the longitudinal direction D1 of the transmission assembly 10a and connected to the processing tool 30 by penetrating the end wall 182a and the thermal insulation member 19a. In some embodiments, the thermal insulation member 19a is sandwiched between the end wall 182a and the processing tool 30. With the thermal insulation member 19a, the temperature of the power cables 11a and the fluid conduits 12a may be kept until they are connected to the corresponding connectors (not shown in figures) of the processing tool 30. In some embodiments, the thermal insulation member 19b includes a vacuum chamber.

In operation, heat generated by the power cables 11a is transferred to the intermediate member 18a first, and the heat of the intermediate member 18a is then transferred to the fluid conduits 12a by thermal radiation. As a result, heat of the power cables 11a is efficiently dissipated and the temperature of the fluid conduits 12a can be increased so as to prevent condensation from gases in the fluid conduits 12a. Embodiments shown in FIGS. 2 and 3 advantageously reduce power loss by decreasing the temperature of the power cables 11a and reduce a gas usage by elevating the temperature of the fluid conduits 12a because a pressure drop in the fluid conduits 12a can be effectually avoided. In one exemplary embodiments, the temperature of the power cables 11a is dropped from about 30-70 Celsius degrees to about 21-45 Celsius degrees, and the temperature of the fluid conduits 12a is elevated from about 15-26 Celsius degrees to about 20-30 Celsius degrees.

In some embodiments, as shown in FIGS. 2 and 3, the transmission assembly 10a further includes a number of sensors 161a and 162a and a number of active temperature control members 171a and 172a. The sensors 162a and the active temperature control members 172a are positioned nearby the fluid conduits 12a. The sensors 161a and active temperature control members 171a are positioned nearby the power cables 11a. The sensors 161a and 162a may be used to detect temperature of the neighboring fluid conduits 12a or power cables 11a. The active temperature control members 171a and 172a may include a heater or a thermoelectric cooling chip and are configured to actively control temperature of the neighboring fluid conduits 12a or power cables 11a in response to an abnormality detected by the sensors 161a and 162a. Details of the control method will be described in more detail with reference to the embodiments shown in FIG. 9.

Figure 4:
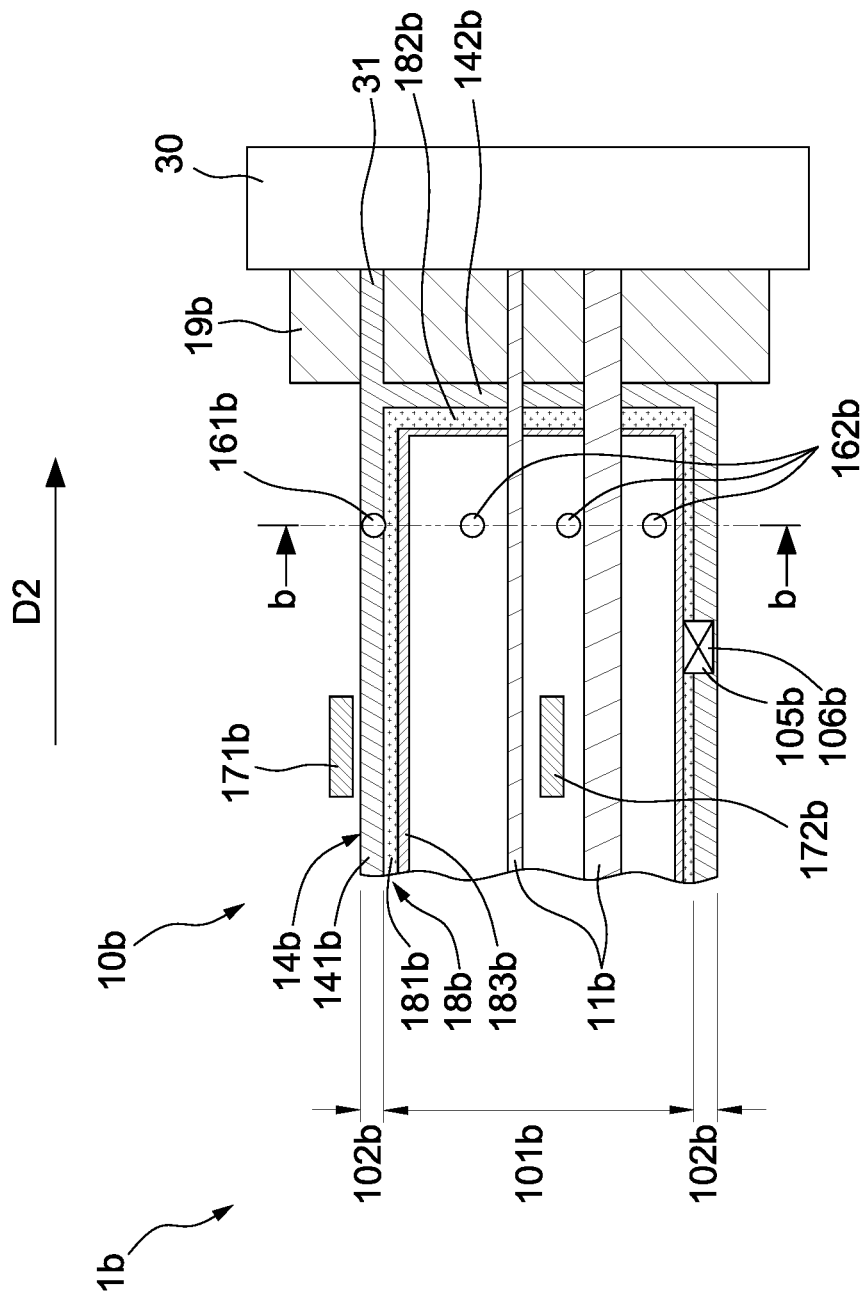
FIG. 4 is a schematic cross-sectional view of partial elements in a semiconductor fabrication facility taken along an axial direction of a transmission assembly, in accordance with some embodiments of present disclosure.
Figure 5:
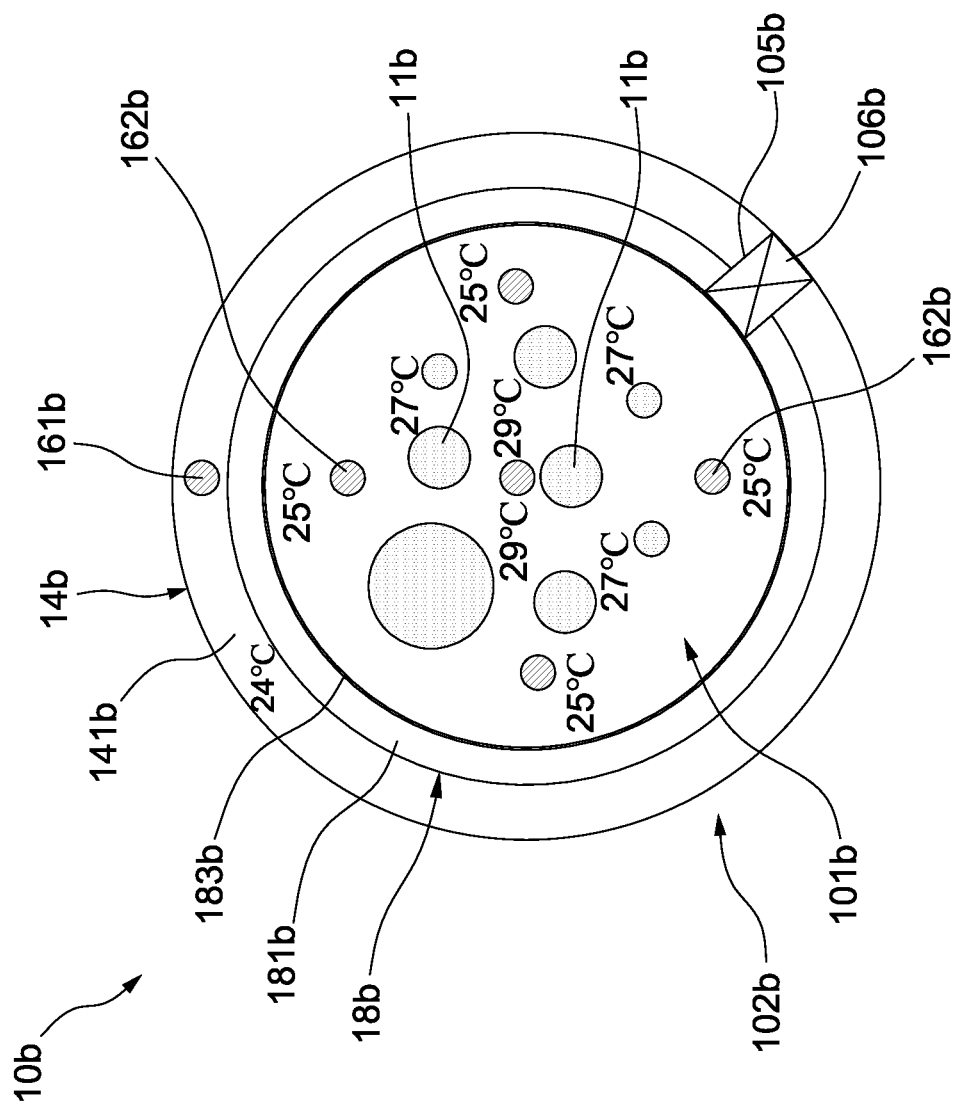
FIG. 5 is a schematic cross-sectional view taken along line b-b of FIG. 4.

Please refer FIGS. 4 and 5, FIG. 4 is a schematic cross-sectional view of partial elements in a semiconductor fabrication facility 1b taken along an axial direction of a transmission assembly 10b, in accordance with some embodiments of present disclosure, and FIG. 5 is a schematic cross-sectional view taken along line b-b of FIG. 4. In FIG. 5, symbols without lead lines represent temperatures of corresponding elements or temperature of the nearby surrounding. The components in FIGS. 4 and 5 that use the similar reference numerals as the components of FIG. 1 refer to the same components or equivalent components thereof. For the sake of brevity, the discussion of the semiconductor fabrication facility 1b will focus on the difference between the semiconductor fabrication facility 1b and the semiconductor fabrication facility 1.

In some embodiments, the transmission assembly 10b of the semiconductor fabrication facility 1b is used to deliver electric power from the facility system (see FIG. 1) to the processing tool 30 and remove PCW from the processing tool 30 to the facility system for further processing. In some embodiments, the transmission assembly 10b includes a number of power cables 11b, a fluid conduit 14b, an intermediate member 18b, and a thermal insulation member 19b. The transmission assembly 10b has a substantially circular cross-section which defines a central region 101b and a peripheral region 102b.

The intermediate member 18b is configured to regulate a transmission of thermal energy between the transmission line located in the peripheral region 102b (i.e., fluid conduit 14b) and the transmission lines located in the central region 101b (i.e., power cables 11b). In some embodiments, the intermediate member 18b includes a side wall 181b, an end wall 182b and a reflection layer 183b. The side wall 181b has a ring-shaped and is located at the interface of the central region 101b and the peripheral region 102b. The end wall 182b is connected to an end of the side wall 181b and is located adjacent to the processing tool 30. The side wall 181b and the end wall 182b collective constitutes a thermal conduction layer of the intermediate member 18b, and the reflection layer 183b is formed on the internal surface of the thermal conduction layer. In some embodiments, the intermediate member 18b is a metal sheet with a relatively high thermal conductivity so as to allow the temperature of the fluid conduit 14b to be evenly distributed around the transmission assembly 10b. In addition, the reflection layer 183b has a high radiation reflectivity to reflect thermal radiation emitted from the power cables 11b. In some embodiments, the intermediate member 18b is omitted, the power cables may be supported on the internal surface of the fluid conduit 14b by suitable means.

The fluid conduit 14b is located in the peripheral region 102b and has a ring-shaped cross-section which surrounds the external surface of the intermediate member 18b. The power cables 11b are located in the central region 101b of the transmission assembly 10b. As a result, the power cables 11b are completed surrounded by the fluid conduit 14b. In some embodiments, as shown in FIG. 3, the fluid conduit 14b is in directly contact with the intermediate member 18b, and the power cables 11b are distant away from the intermediate member 18b. In some embodiments, the power cables 11b may have varied diameters. The fluid conduit 14b includes a ring-shaped extension portion 141b and an end portion 142b connected to one end of the ring-shaped extension portion 141b for guiding PCW from an outlet 31 of the processing tool 30 to the extension portion 141b. The end portion 142b of the fluid conduit 14b is located closer to the processing tool 30 than the end wall 182b of the intermediate member 18b. The power cables 11b extend along the longitudinal direction D2 of the transmission assembly 10b and connected to the processing tool 30 by penetrating the end wall 182b, the end portion 142b and the thermal insulation member 19b.

In some embodiments, the thermal insulation member 19b is sandwiched between the end portion 142b and the processing tool 30. With the thermal insulation member 19b, the temperature of the power cables 11b and the fluid conduit 14b may be kept until they are connected to the corresponding connectors (not shown in figures) or outlet 31 of the processing tool 30. In some embodiments, the thermal insulation member 19b includes a vacuum chamber.

In operation, most of heat generated by the power cables 11b is blocked by the reflection layer 133b, and the thermal conduction layer of the intermediate member 18b is sufficiently cooled by the fluid conduit 14b. As a result, heat of the power cables 11b is efficiently dissipated. Embodiments shown in FIGS. 4 and 5 advantageously reduce power loss by decreasing the temperature of the power cables 11b without or slightly increasing the temperature of the fluid conduits 14b. In the embodiment where the intermediate member 18b with no reflection layer 183b, the temperature of the fluid conduits 14b will be elevated by the thermal energy transferred from the power cables 11b.

In some embodiments, as shown in FIGS. 4 and 5, the transmission assembly 10b further includes a number of sensors 161b and 162b and a number of active temperature control members 171b and 172b. The sensors 161b is positioned in the fluid conduits 14b, and the active temperature control members 171b is positioned nearby the fluid conduits 14b and located in the peripheral region 102b. The sensors 162b and the active temperature control members 172b are positioned nearby the power cables 11b. The sensors 161b and 162b may be used to detect temperature of the neighboring fluid conduit 14b or power cables 11b. The active temperature control members 171b and 172b may include a heater or a thermoelectric cooling chip and are configured to actively control temperature of the neighboring fluid conduits 14b or power cables 11b in response to an abnormality detected by the sensors 161b and 162b. Details of the control method will be described in more detail with reference to the embodiments shown in FIG. 9.

In some embodiments, a flow path 105b is formed at the side wall 181b of the intermediate member 18b and the extension portion 141b. The flow path 105b fluidly communicates the central region 101b and the peripheral region 102b of the transmission assembly 10b. A release valve 106b is positioned in the flow path 105b to regulate a flow of ambient gas outside the transmission assembly 101 to the central region 101b to chill the power cables 11b positioned therein.

The configuration of the transmission assembly should not be limited to the embodiments above. In one another embodiment, the fluid conduits 12a in the embodiment shown in FIGS. 2 and 3 is replaced with a single fluid conduit which is used to deliver the exhaust from the processing tool 30. The power cables 11a may be arranged on an external wall of the exhaust conduit or via an intermediate member. In still one another embodiment, the fluid conduit in the peripheral region 102b in the embodiment shown in FIGS. 4 and 5 is used to deliver exhaust from the processing tool 30.

Figure 6:
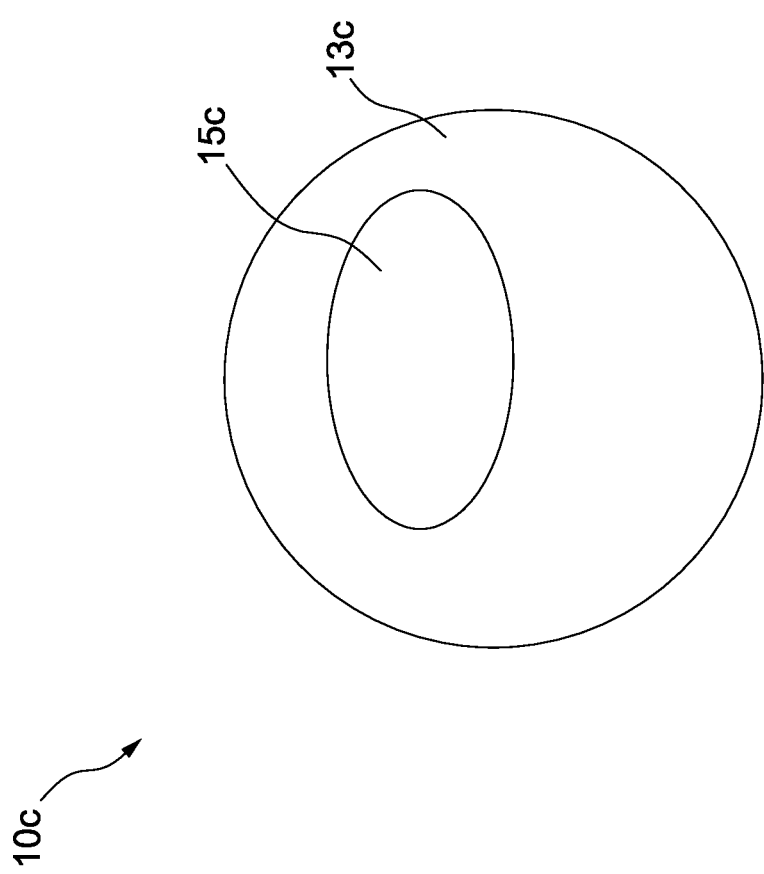
FIG. 6 is a schematic cross-sectional view of a transmission assembly, in accordance with some embodiments of present disclosure.

In yet another embodiment shown in FIG. 6, the transmission assembly 10c includes two fluid conduits without power cables. One of the fluid conduits may be a fluid conduit 13c to deliver PCW to the processing tool 30 and the other fluid conduit may be a ring-shaped fluid conduit 15c which surrounds the fluid conduit 13c to remove exhaust from the processing tool 30.

Figure 7:
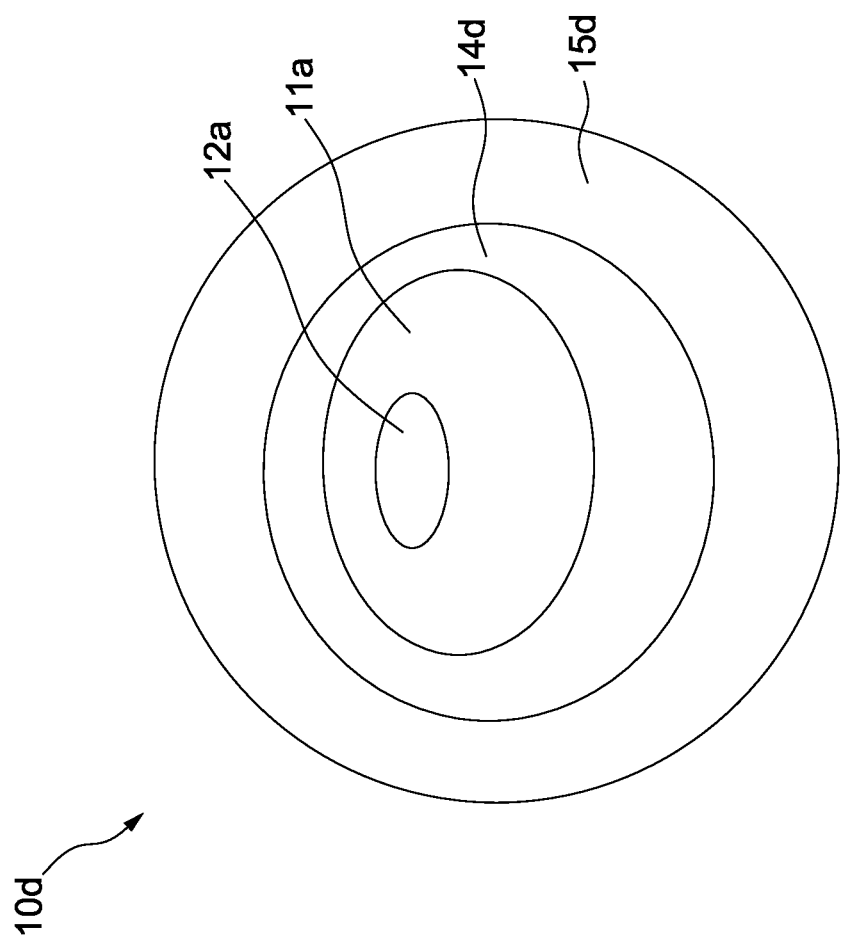
FIG. 7 is a schematic cross-sectional view of a transmission assembly, in accordance with some embodiments of present disclosure.

In still yet another embodiment shown in FIG. 7, the transmission assembly 10d includes the power cables 11a and fluid conduit 12a shown in the embodiment of FIGS. 2 and 3. The transmission assembly 10d further includes a ring-shaped fluid conduit 14d surrounding the power cable 11a and a ring-shaped fluid conduit 15d surrounding the fluid conduit 14d. The fluid conduit 14d is used to remove PCW from the processing tool 30 and the fluid conduit 15d is used to remove exhaust from the processing tool 30. With such arrangement, the heat generated from the power cables 11a can be cooled down by both the fluid conduits 12a and the fluid conduit 14d. In addition, the temperature of the fluid conduit 14d can be preserved by the fluid conduit 15d to prevent a significant temperature drop of the fluid conduit 14d.

Figure 8:
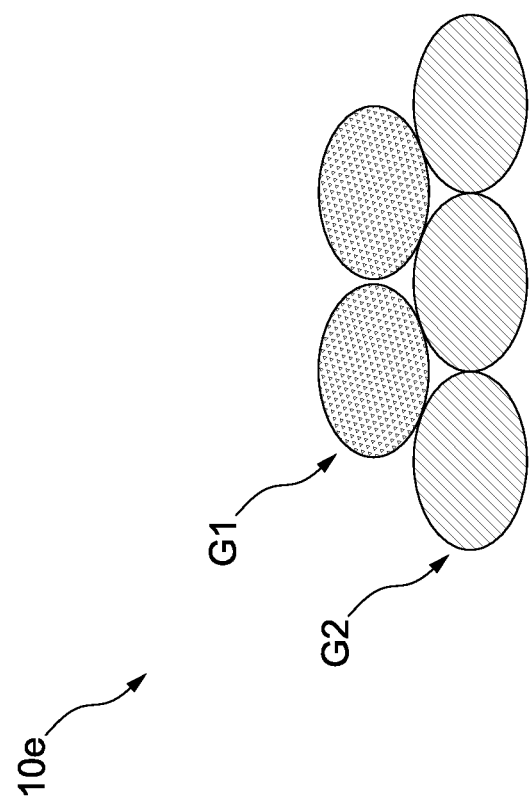
FIG. 8 is a schematic cross-sectional view of a transmission assembly, in accordance with some embodiments of present disclosure.

In another embodiment shown in FIG. 8, the transmission assembly 10e includes a first group of transmission lines G1 and a second group of transmission lines G2. The first group of transmission lines G1 may be selected from one of the power cables 11 or the fluid conduits 12-15 and the second group of transmission lines G2 is different from the first group of transmission lines G1 as long as there is temperature difference between the two groups. In some embodiments, the first group of transmission lines G1 is stacked on and in direct contact with the second group of transmission lines G2. With such arrangement, thermal energy can be sufficiently utilized in a semiconductor fabrication facility.

Figure 9:
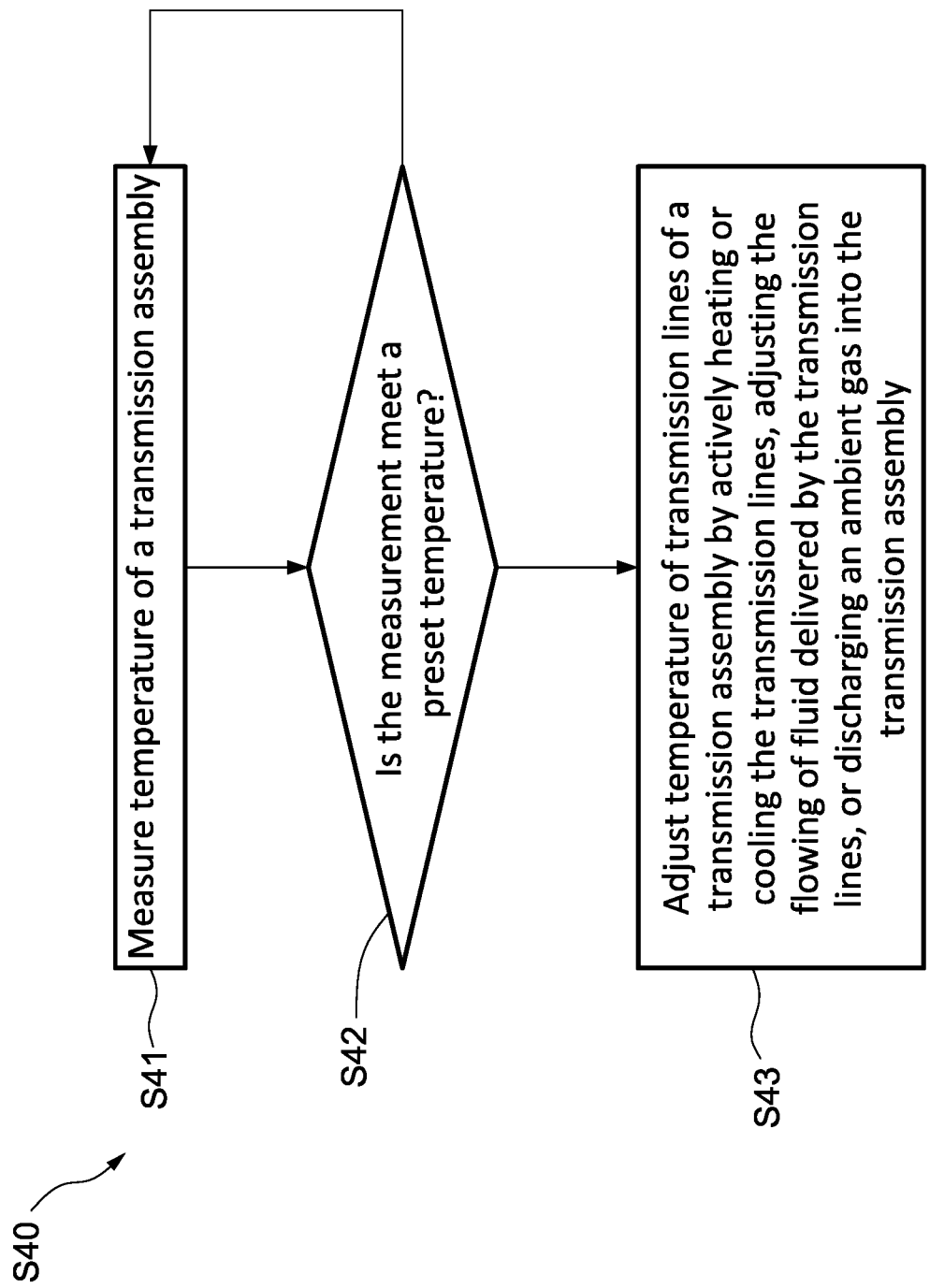
FIG. 9 is a flow chat of a method for managing heat in a semiconductor fabrication facility, in accordance with some embodiments of present disclosure.

FIG. 9 is a simplified flowchart of a method S40 of managing temperature in a semiconductor fabrication facility, in accordance with some embodiments. For illustration, the flow chart will be described along with the drawings shown in FIGS. 2-5. Some of the described stages can be replaced or eliminated in different embodiments.

The method S40 includes operation S41, in which temperature of the transmission assembly 10a or 10b is measured. In some embodiments, data associated with temperature at selected locations in the transmission assembly 10a or 10b is produced by the sensors 161a, 162a, 161b and 162b and is sent to a control system (not shown in figures). The measurement may be executed while liquid is delivered by the fluid conduits 12a or 14b and electric power is delivered by power cables 11a or 11b. The data associated with temperature may be measured multiple times during at regular time intervals, such as every 0.5 seconds, and the data associated with temperature at each measured time interval are recorded separately in the control system.

The method S40 also includes operation S42, in which the temperature measured in operation S41 is compared with an expected temperature stored in the archive database. In some embodiments, data associated with the expected temperature is input by a personnel or is determined according to the previous process in which no abnormality happens. Since the data associated with the expected temperature represents normal temperature of the transmission assembly, this data is also referred to as "expected temperature".

After the comparison, if the temperature measurement meets the expected temperature, the method repeats operations S41 and S42. However, if the temperature measurement does not meet the expected temperature, the method continues with operation S43, in which temperature of the transmission assembly is adjusted.

In some embodiments, when the data indicates that the temperature measurement have departed from expected temperature, the control system triggers a control signal to adjust temperature of the transmission assembly. For example, the active temperature control members 171a, 172a, 171b, 172b are configured to actively control the temperature of the fluid conduits 12a or 14b and the power cables 11a or 11b by heating the fluid conduits 12a or 14b or cooling the power cables 11a or 11b. Alternatively, the control system drives pumps which actuates the flow in the fluid conduits 12a or 14b to increase the flow rate of the flow so as to decrease the temperature of the fluid conduits 12a or 14b and in turn cool the power cables 11a or 11b. In some embodiments, the method also includes measure temperature of ambient gas to determine if the temperature of the ambient gas is lower than a predetermined value, for example, the temperature of the fluid conduit 14b. If the temperature of the ambient gas is lower than the predetermined value, the control system may issue a control signal to open the release valve 106b to discharge ambient gas to chill the power cables 11b in the central region 101b.

As shown in FIGS. 3 and 5, after the temperature of the power cables 11a and 11b are adjusted, the power cables 11a and 11b in one transmission assembly may be varied due to different impedances. In addition, the temperature in different locations in the central regions 101a or 101b is related to a distance between the corresponding locations and the intermediate member 18a or 13b. In some embodiments, with an increase in a distance between the measurement location and the intermediate member 18a or 13b, a greater temperature difference is exhibited. Therefore, the fluid conduit 12a which loads with fluid sensitive to the temperature or the power cables 11b has a higher temperature may be positioned closer to the intermediate member 18a or 13b.

Embodiments of the present disclosure provide a method and a system for managing temperature in a semiconductor fabrication facility. Transmission lines of the semiconductor fabrication facility which have different temperatures are arranged adjacent to one the other, such that thermal energy can be transferred from one of transmission line which has a higher temperature to another transmission line which has a lower temperature. In case where the waste heat of power cables is utilized to elevate temperature of gas conduit or exhaust conduit, the energy loss of the power cable is remarkably dropped. Furthermore, the flow of gas in the gas conduit can be stabilized and a coating which is condensed from exhaust gas in the exhaust conduit can be prevented from forming on internal wall of the exhaust conduit.

According to one embodiment of the present disclosure, a semiconductor fabrication facility is provided. The semiconductor fabrication facility includes a processing tool and a transmission assembly. The transmission assembly is connected to the processing tool and comprises a number of transmission lines used to supply electric power or a fluid to the processing tool or remove the fluid or an exhaust gas from the processing tool. The transmission lines includes a first transmission line and a second transmission line. The first transmission line has a first temperature and the second transmission line has a second temperature. The second temperature is higher than the first temperature. The first transmission line and the second transmission line are arranged such that a thermal energy of the second transmission line is able to be transmitted to the first transmission line to change the first temperature of the first transmission line.

According to another embodiment of the present disclosure, a semiconductor fabrication facility is provided. The semiconductor fabrication facility includes a processing tool and a transmission assembly. The transmission assembly has a cross section defining a central region and a peripheral region surrounding the central region. The transmission assembly includes a number of power cables positioned in one of the central region and the peripheral region and connected to the processing tool to supply electric power to the processing tool. The transmission assembly further includes at least one fluid conduit positioned in the other one of the central region and the peripheral region and connected to the processing tool to supply a fluid to the processing tool or remove the fluid or an exhaust gas from the processing tool. Each one of the power cables has a temperature that is higher than a temperature of the fluid conduit.

According to yet another embodiment of the present disclosure a method for managing a temperature in a semiconductor fabrication facility is provided. The method includes supplying electric power to one or more processing tools through a plurality of power cables. The method also includes delivering a fluid in a fluid conduit which is connected to the processing tools and positioned adjacent to the power cables. The method further includes decreasing a temperature of the power cables by controlling a flow of the fluid in the fluid conduit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for managing a temperature in a semiconductor fabrication facility, comprising:
   supplying electric power to a processing tool through a plurality of power cables;
   delivering a fluid in a fluid conduit which is connected to the processing tool and positioned adjacent to the power cables; and
   decreasing a temperature of the power cables by controlling a flow of the fluid in the fluid conduit.

2. The method of claim 1, wherein the fluid is delivered through the fluid conduit which has a ring-shaped cross-section surrounding the power cables.

3. The method of claim 2, further comprising using an intermediate member positioned between the power cables and the fluid conduit to regulate a transmission of thermal energy between the power cables and the fluid conduit.

4. The method of claim 2, further comprising supplying an ambient gas to a central region that is surrounded by the fluid conduit to decrease the temperature of the power cables.

5. The method of claim 1, wherein delivering the fluid in the fluid conduit comprises supplying a process cooling water into the processing tool.

6. The method of claim 1, wherein delivering the fluid in the fluid conduit comprises removing a process cooling water or an exhaust gas from the processing tool.

7. The method of claim 1, further comprising controlling the flow of the fluid based on real-time data associated with temperature of the power cables to control the temperature of the power cables.

8. The method of claim 3, wherein heat generated by the power cables is transferred to the intermediate member first, and the heat of the intermediate member is then transferred to the fluid conduits by thermal radiation.

9. A method for cooling power cables in a semiconductor fabrication facility, comprising:
    positioning a fluid conduit adjacent to a plurality of power cables connected to a semiconductor processing tool;
    guiding a fluid through the fluid conduit; and
    actively adjusting a flow rate of the fluid based on a temperature sensor positioned nearby the power cables,
    wherein data associated with temperature produced by the temperature sensor is sent to a control system configured to maintain the power cables at a temperature by modulating the flow rate of the fluid.

10. The method of claim 9, wherein the fluid is delivered through the fluid conduit which has a ring-shaped cross-section surrounding the power cables.

11. The method of claim 9, further comprising using an intermediate member positioned between the power cables and the fluid conduit to regulate a transmission of thermal energy between the power cables and the fluid conduit.

12. The method of claim 9, further comprising supplying an ambient gas to a central region that is surrounded by the fluid conduit to decrease the temperature of the power cables.

13. The method of claim 9, wherein delivering the fluid in the fluid conduit comprises supplying a process cooling water into the semiconductor processing tool.

14. The method of claim 9, wherein delivering the fluid in the fluid conduit comprises removing a process cooling water or an exhaust gas from the semiconductor processing tool.

15. A method for thermal management in a semiconductor fabrication facility, comprising:
    supplying electric power to a semiconductor processing tool via a power cable;
    positioning a fluid conduit in close proximity to the power cable;
    delivering a fluid within the fluid conduit to absorb heat radiated from the power cable; and
    regulating a flow of the fluid based on real-time data associated with temperature of the power cable to control a temperature of the power cable.

16. The method of claim 15, wherein the fluid is delivered through the fluid conduit which has a ring-shaped cross-section surrounding the power cable.

17. The method of claim 15, further comprising using an intermediate member positioned between the power cable and the fluid conduit to regulate a transmission of thermal energy between the power cable and the fluid conduit.

18. The method of claim 15, further comprising supplying an ambient gas to a central region that is surrounded by the fluid conduit to decrease the temperature of the power cable.

19. The method of claim 15, wherein delivering the fluid in the fluid conduit comprises supplying a process cooling water into the semiconductor processing tool.

20. The method of claim 15, wherein delivering the fluid in the fluid conduit comprises removing a process cooling water or an exhaust gas from the semiconductor processing tool.

* * * * *